(12) United States Patent
Salessi et al.

(10) Patent No.: US 7,020,019 B2
(45) Date of Patent: Mar. 28, 2006

(54) SYSTEM AND METHOD FOR DESTRUCTIVE PURGE OF MEMORY DEVICE

(75) Inventors: Nader Salessi, Laguna Niguel, CA (US); Hosein Gazeri, Irvine, CA (US)

(73) Assignee: SimpleTech, Inc., Santa Ana, CA (US)

( * ) Notice: Subject to any disclaimer, the term of this patent is extended or adjusted under 35 U.S.C. 154(b) by 0 days.

(21) Appl. No.: 10/912,114

(22) Filed: Aug. 6, 2004

(65) Prior Publication Data

US 2005/0259469 A1 Nov. 24, 2005

Related U.S. Application Data

(60) Provisional application No. 60/573,281, filed on May 21, 2004.

(51) Int. Cl.
*G11C 16/04* (2006.01)

(52) U.S. Cl. ............... 365/185.04; 365/185.29; 365/185.33; 365/218

(58) Field of Classification Search ............ None
See application file for complete search history.

(56) References Cited

U.S. PATENT DOCUMENTS

| | | | | |
|---|---|---|---|---|
| 4,783,801 A | * | 11/1988 | Kaule | 713/194 |
| 5,027,397 A | * | 6/1991 | Double et al. | 713/194 |
| 5,572,696 A | * | 11/1996 | Sonobe | 711/202 |
| 5,758,121 A | * | 5/1998 | Fukuzumi | 711/164 |
| 6,292,898 B1 | * | 9/2001 | Sutherland | 726/34 |
| 6,320,787 B1 | * | 11/2001 | Ikeda | 365/185.04 |
| 6,819,590 B1 | * | 11/2004 | Goda et al. | 365/185.03 |

* cited by examiner

*Primary Examiner*—Son Mai
(74) *Attorney, Agent, or Firm*—McDermott Will & Emery LLP

(57) ABSTRACT

A memory purge system destructively purges the memory circuits of a memory device. The system includes a power supply for supplying a selectable voltage and current. Switching circuits electrically connect the power supply to the memory circuits of the memory device. A controller selects a voltage and current supplied by the power supply and activates the switching circuit to apply the voltage and current to the memory circuits. The controller determines whether the memory circuits have been destroyed by monitoring current flow into the memory circuits.

14 Claims, 2 Drawing Sheets

SYSTEM AND METHOD FOR DESTRUCTIVE PURGE OF MEMORY DEVICE

This application claims the benefit of the U.S. Provisional Application No. 60/573,281, filed May 21, 2004, entitled "Systems and Methods for Destructive Purge of Flash Memory," which is hereby incorporated by reference.

FIELD OF THE INVENTION

The present invention relates to memory devices for storing digital data. More particularly, the present invention concerns systems and methods for destructively purging memory devices.

BACKGROUND OF THE INVENTION

Solid-state memory, such as flash memory, is being used in an ever-increasing number of memory devices. The ease with which digital data can be written and rewritten, together with the non-volatile nature of the memory, makes these memory devices appealing for a large number of applications. When using these memory devices to store highly sensitive data, such as in military applications, additional security issues must be considered.

For example, when using a memory device to store sensitive data, it may become necessary to prevent further access to the stored digital data. Simply erasing the data stored in the memory device may not guarantee that the data is beyond retrieval from the memory circuits. In order to ensure that the data is no longer accessible, a destructive purge of the memory circuits is necessary to damage the memory circuits beyond repair.

Conventional systems have been developed to perform a destructive purge of a memory device by applying a large amount of charge, such as through the discharge of a capacitor, into the memory circuits. However, these conventional systems have several drawbacks. One drawback is that these conventional systems typically require a large capacitor, for example greater than 5,000 µF. A capacitor of this size requires significant space on the device board. Another drawback is that capacitor-based purge systems typically must be modified and reconfigured to work with different types of memory chips and are not easily scalable for different flash memory configurations.

SUMMARY OF THE INVENTION

Various embodiments of the invention concern an intelligent memory purge system for destructively purging a memory device. The memory purge system selectively applies a voltage and current to memory circuits within the memory device to destroy one or more transistors in the memory circuit and damage the surrounding substrate. The memory purge system can be implemented in a small form factor that generates a minimal amount of heat, and is scalable for different flash technologies and configurations.

According to one aspect of the invention, a memory purge system is provided for destructively purging a memory device. The memory purge system includes a power supply for supplying a selectable voltage and current and a switching circuit for electrically connecting the power supply to a memory circuit of the memory device. In response to a purge command, a controller selects a voltage and current supplied by the power supply and activates the switching circuit to apply the selected voltage and current to the memory circuit.

Preferably, the memory purge system includes a current detector for detecting current between the power supply and the memory circuit. The controller monitors the current and if the detected current drops below a threshold, the controller deactivates the switching circuit to stop the application of the voltage and current to the memory circuit. In certain embodiments, the voltage and current are applied to the memory circuit for a predetermined period of time. If the detected current does not drop below the threshold within the predetermined period of time, the controller selects a higher voltage supplied by the power supply and reactivates the switching circuit to apply the higher voltage and current for the predetermined period of time.

Preferably, the memory purge system includes a switching circuit for each memory circuit included in the memory device. By activating and deactivating the switching circuit, the controller applies the selected voltage and current to each of the memory circuits in time division multiplex fashion.

The foregoing summary of the invention has been provided so that the nature of the invention may be understood quickly. A more complete understanding of the invention can be obtained by reference to the following detailed description of the invention in connection with the accompanying drawings.

DETAILED DESCRIPTION OF THE INVENTION

Figure 1:
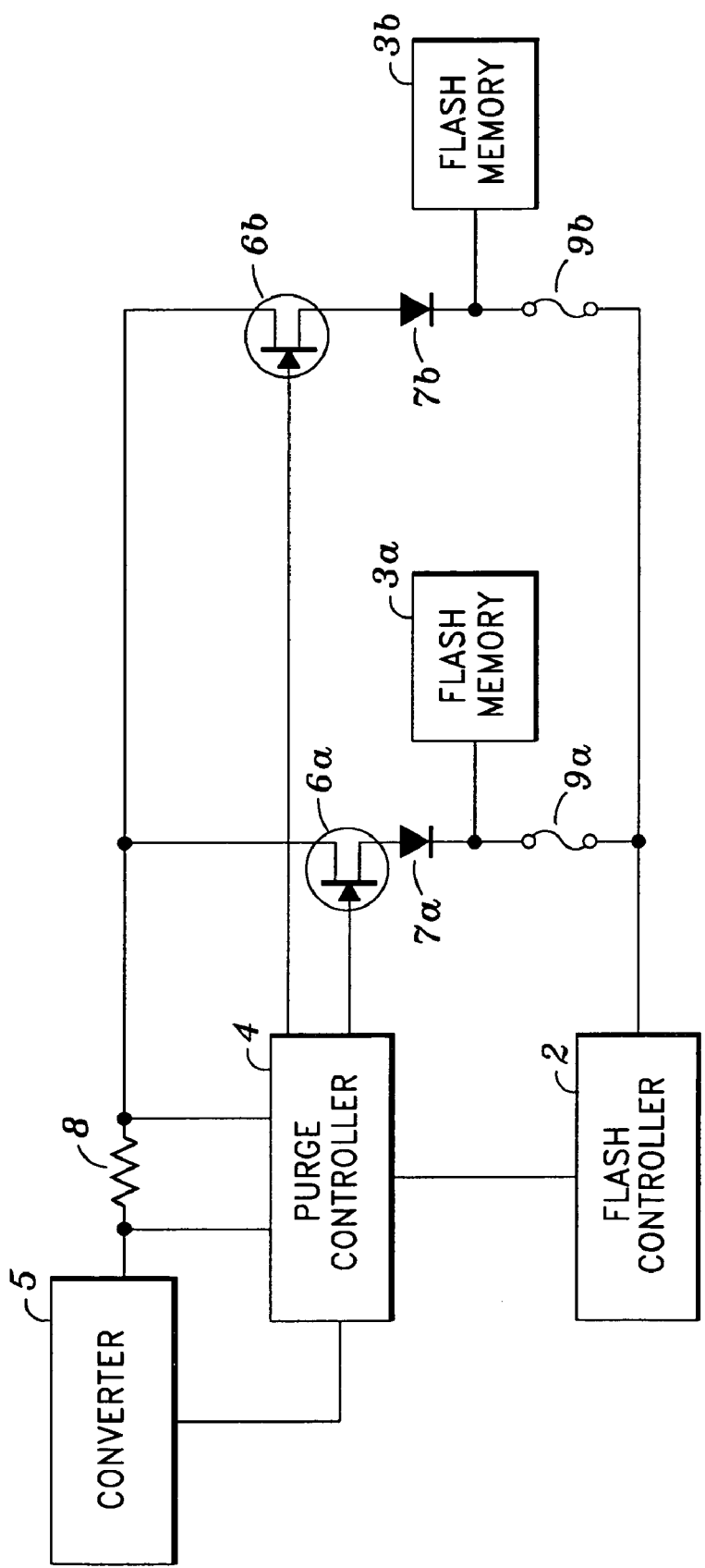
FIG. 1 is a block diagram depicting the basic components of a memory device according to one embodiment of the invention.

FIG. 1 is a block diagram depicting the basic components of a flash memory device having a memory purge system according to one embodiment of the invention. As shown in FIG. 1, the memory device includes flash controller 2 and two flash memory chips 3a and 3b. Flash controller 2 receives data to be stored in the memory device via an external interface, which is not shown in this diagram. Flash controller 2 then stores the received data in flash memory, which is comprised of flash memory chips 3a and 3b. Alternatively, flash controller 2 retrieves data stored in flash memory 3a and 3b in response to a read command and transmits the retrieved data to a requesting device via the external interface.

The read/write operations of flash controller 2 and flash memory chips 3a and 3b are substantially similar to those used in conventional flash memory devices and are well understood by those skilled in the art. Accordingly, these functions of the memory device will not be explained in further detail in this description. It is also to be understood that flash memory devices typically include multiple flash controllers, with each flash controller managing two or more flash memory chips. For purposes of this description, however, only one flash controller and two flash memory chips are described. One skilled in the art will recognize that the present invention can be applied to memory devices having more than one flash controller and more than two flash memory chips.

FIG. 1 also depicts purge controller 4, converter 5, transistors 6a and 6b, diodes 7a and 7b, resistor 8 and fuses 9a and 9b. Purge controller 4 is a microcontroller configured to control a destructive purge process. According to one embodiment of the invention, purge controller 4 is implemented using an 8-bit microcontroller having analog control capabilities. However, the invention is not limited to this type of microcontroller and purge controller 4 can be implemented using other types of controllers having similar functionality. Purge controller 4 controls the operations of converter 5 and transistors 6a and 6b, as described in detail below. Purge controller 4, converter 5 and transistors 6a and 6b form the primary components of the memory purge system.

Converter 5 supplies a selectable voltage and current used in the destructive purge process. According to one embodiment, converter 5 is implemented with a high-efficiency DC-to-DC power converter for converting input power into the selectable voltage and current. The input power to converter 5 is preferably supplied from a power source (not shown) that is external to the memory device. However, the invention can also be implemented using a power source, such as a battery, that is incorporated into the memory device itself. The levels of voltage and current are controlled by purge controller 4 in accordance with the destructive purge process of the invention. According to one embodiment of the invention, 5V/5A input power is converted by converter 5 into a voltage selected from a range of 5V to 16V and a current selected from a range of slightly greater than 0A to 4A. The levels of voltage and current are not limited to those described above and may vary depending on the input power and the memory device and types of memory chips used in the device.

The output of converter 5 is connected to flash memory chips 3a and 3b via corresponding switching circuits. According to one embodiment of the invention, the switching circuits for flash memory chips 3a and 3b comprise transistors 6a and 6b, respectively. Transistors 6a and 6b act as switches for applying the voltage and current output by converter 5 to flash memory chips 3a and 3b. Transistors 6a and 6b are preferably implemented using high-current field-effect transistors (FETs); however, other types of transistors and switching circuitry can be used to implement the invention. Purge controller 4 is connected to the gates of each of transistors 6a and 6b. By applying a voltage to the respective gates of transistors 6a and 6b, purge controller 4 controls the application of the voltage and current supplied by converter 5 to flash memory chips 3a and 3b.

Diodes 7a and 7b are used after the transistors 6a and 6b, respectively. Diodes 7a and 7b limit the direction of current flow between converter 5 and flash memory chips 3a and 3b. Specifically, diodes 7a and 7b restrict current from flowing from flash memory chips 3a or 3b back to transistors 6a and 6b.

The memory purge system is connected to selected pins on flash memory chips 3a and 3b via diodes 7a and 7b, respectively. The connection pin is selected based on two criteria. First, pins are selected based on importance for data input/output. Second, pins are selected based on weakness and sensitivity to internal latch-up. Both of these criteria depend on the technology and geometry used in fabricating the internal memory circuits and typically more than one pin of a particular flash memory chip may be suitable for implementing the invention. For example, a bi-directional pin was determined to be a suitable connection pin for flash memory chips based on NAND technology and fabricated using 0.13 μm geometry. For flash memory chips based on AND technology, the clock pin was determined to be a suitable connection pin.

Resistor 8 is used by purge controller 4 as a current detector. Specifically, purge controller 4 measures the voltage across resistor 8 to determine the current flowing from converter 5 to the flash memory chips. Purge controller 4 controls the destructive purge process based on the detected current, as described in more detail below.

Fuses 9a and 9b are used in the connection between flash controller 2 and the respective connection pins of flash memory chips 3a and 3b to prevent excessive current from reaching, disrupting or destroying flash controller 2. For example, if the current applied to one of the flash memory chips during the destructive purge process exceeds the maximum allowable current for flash controller 2, the respective fuse breaks the connection and prevents the current from reaching flash controller 2. Fuses 9a and 9b are implemented either using a separate fuse component or by shaping the traces connected the flash memory chips to flash controller 2 so that the trace will be destroyed at dangerously high current levels. Alternative fuse mechanisms understood by those skilled in the art can also be used to implement fuses 9a and 9b.

In the embodiment of the invention described above, separate controllers are used to implement flash controller 2 and purge controller 4. One skilled in the art will recognize that alternative embodiments of the invention may use a single controller to implement flash controller 2 and purge controller 4. Alternatively, a master controller might also be used in the invention to control and forward data and instructions to flash controller 2 and purge controller 4.

Figure 2:
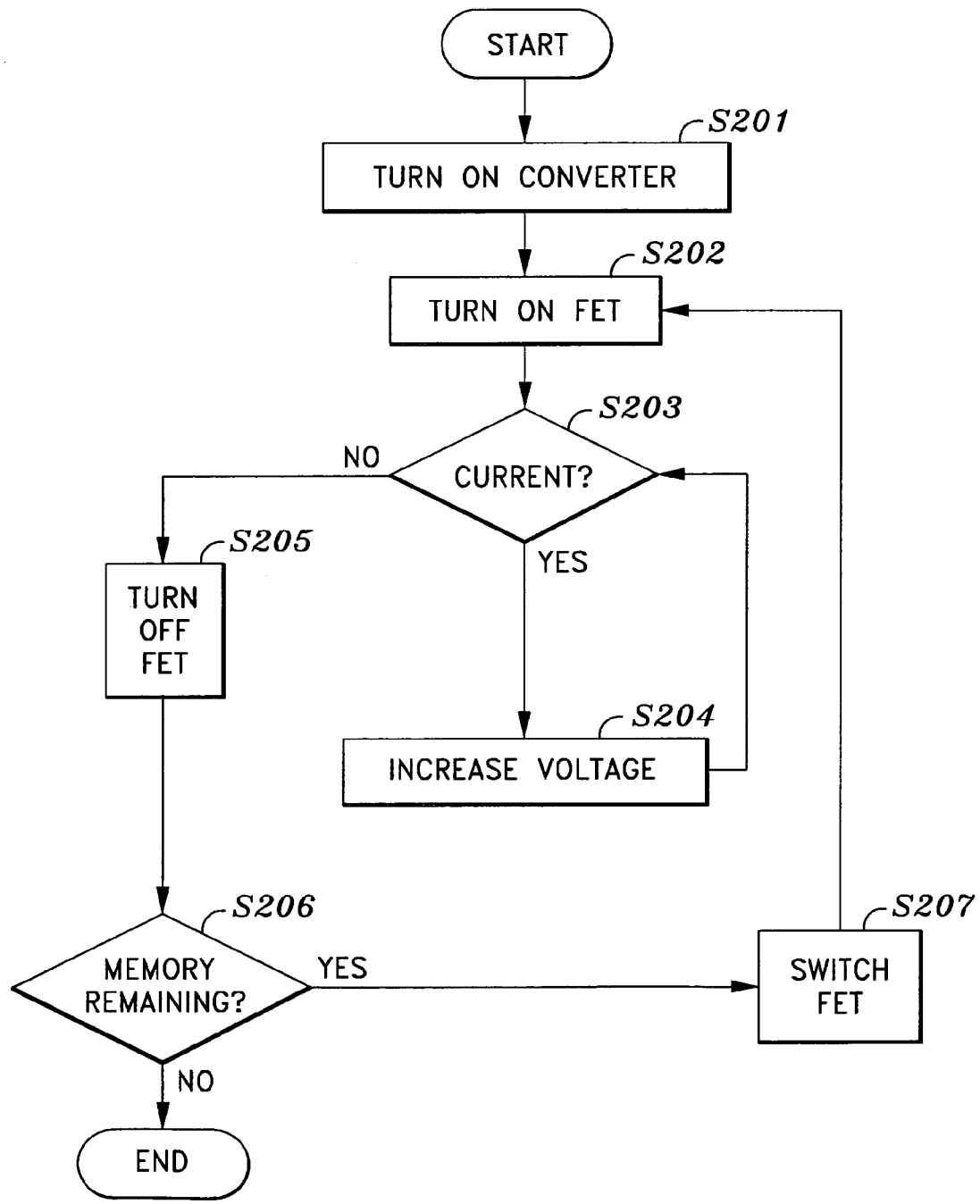
FIG. 2 is a flowchart depicting a process for a destructive purge of a memory circuit according to one embodiment of the invention.

The destructive purge of a memory device according to one embodiment of the invention will now be described with reference to the flowchart depicted in FIG. 2. The destructive purge process is started when purge controller 4 receives a purge command to destructively purge the memory device. Alternatively, purge controller 4 may start the destructive purge process in response to one or more conditions, or combinations of conditions, occurring externally and internally to the memory device. In preparation for the destructive purge, flash controller 2 is placed in an idle state for the duration of the destructive purge process.

Preferably, converter 5 is disabled prior to the start of the destructive purge process. After receiving a purge command to start a destructive purge process, purge controller 4 turns on converter 5 and selects the initial levels of voltage and current to be output in step S201. The levels of voltage and current applied to the flash memory chips must be carefully selected. The voltage and current levels are set high enough to cause irreversible latch-up in one or more transistors beyond the integrated circuit pad of the flash memory chip. The latch-up destroys the transistor and damages the surrounding substrate. However, the levels of voltage and current cannot be so high as to destroy the bond wire connecting the pad, which can be repaired and the data stored within the flash memory chip recovered, before the internal transistors are damaged. According to one embodiment of the invention, the initial levels of voltage and current are selected based on the maximum power rating set for the particular flash memory chip used in the memory device. For example, initial levels of 12 V and 2A are selected by purge controller 4 for a flash memory chip having a maximum power rating of 24 watts.

In step S202, purge controller 4 turns on the first transistor, transistor 6a, connecting converter 5 to the selected pin of flash memory chip 3a by applying a voltage to the gate of transistor 6a. When transistor 6a is turned on, the voltage and current provided by converter 5 pass through diode 7a and are applied to the memory circuit of flash memory chip 3*a* via the selected pin. In this embodiment transistor 6*a* is turned on first. It is to be understood, however, that the order in which the transistors are turned on or off can be changed without departing from the scope of the invention.

The selected voltage and current are applied to the selected pin of flash memory chip 3*a* until irreversible latch-up occurs in the internal transistors of the memory chip and destroys one or more of the transistors. When the internal transistors are destroyed, the flow of current through the memory chip is disrupted. To determine when destruction of the memory circuit transistors has occurred, purge controller 4 monitors the current flow from converter 5 in step S203 by monitoring the voltage across resistor 8. When the current drops below a threshold value, purge controller 4 determines that the memory circuit within the memory chip is destroyed and turns off transistor 6*a* in step S205. The threshold value is preferably at the micro Amp level or less.

If purge controller 4 determines that current is still flowing, above the threshold current value, between converter 5 and flash memory chip 3*a* in step S203, purge controller 4 increases the voltage output by converter 5 in step S204. According to one embodiment of the invention, the output voltage is increased by 2V in step S204. The invention is not limited to this voltage increase and may be implemented using other voltage increases larger or smaller than 2V. The process repeats steps S203 and S204 until purge controller 4 detects that the current flow has dropped below the threshold value, which indicates that one or more internal transistors in flash memory chip 3*a* have been destroyed.

In an alternative embodiment, purge controller 4 tracks the time during which the voltage and current are applied to flash memory chip 3*a* using a timer that is reset to a predetermined period of time when purge controller 4 turns on resistor 6*a*. In this embodiment, the predetermined period of time is set at 50 ms, however, the period of time may be set anywhere between a fraction of 1 ms and 250 ms. During this period of time, the voltage is held constant while purge controller 4 monitors the current flow. If the predetermined period of time elapses and current is still flowing between converter 5 and flash memory chip 3*a*, the process goes to step S204 where purge controller 4 increases the voltage output by converter 5 as described above. The timer is then reset and purge controller 4 continues to monitor the current flow. These steps are repeated until the current flow drops below the threshold value.

The destructive purge process is performed for each of the flash memory chips in the memory device in sequence. Once current flow has dropped below the threshold value, transistor 6*a* is turned off in step S205. Purge controller 4 then determines in step S206 if another flash memory chip that has not been destroyed remains in the memory device. If another flash memory chip remains, purge controller 4 switches to control the transistor associated with that flash memory chip in step S207 and resets the voltage and current levels output by converter 5 to the initial levels. For example, once flash memory chip 3*a* has been destroyed, purge controller 4 switches to control the next transistor, transistor 6*b* to destroy flash memory chip 3*b*. In order to ensure that no two FETs are active at the same time, purge controller 4 lets a period of time elapse before activating the next transistor. Typically, this idle period of time is around 50 ms, but may be greater or smaller than 50 ms. Steps S202 to S207 are repeated until each flash memory chip in the memory device has been destroyed.

As described above, purge controller 4 determines whether the memory circuit in a particular flash memory chip has been destroyed based on the flow of current into the particular flash memory chip. Once the destructive purge process has been completed, confirmation of the destruction of the flash memory chips can be obtained by flash controller 2 sending a write command to flash memory chips 3*a* and 3*b*. If flash controller 2 does not receive a write confirmation, destruction of the flash memory chips 3*a* and 3*b*, which are connected to flash controller 2, is confirmed. Alternatively, if a write confirmation is received, purge controller 4 starts the destructive purge process again.

As described above, the present invention provides an intelligent destructive purge system for destructively purging memory components within a memory device. Using the described components, the present invention can be implemented having a relatively small form factor, 2.5 inches for example, and a height of 12.5 millimeters or less, while generating a minimal amount of heat. Furthermore, the purge system of the invention is scalable to other flash memory technologies.

The invention has been described using particular illustrative embodiments. It is to be understood that the invention is not limited to the above-described embodiments and that various changes and modifications may be made by one skilled in the art without departing from the spirit and scope of the invention.

What is claimed is:

1. A memory purge system for destructively purging a memory device, the memory purge system comprising:
   a power supply for supplying a selectable voltage and current;
   a switching circuit for electrically connecting said power supply to a memory circuit of the memory device;
   a controller for selecting a first voltage and current supplied by said power supply and activating said switching circuit to apply the selected first voltage and current to the memory circuit in response to a purge command; and
   a current detector for detecting current between said power supply and the memory circuit, wherein, if the detected current drops below a threshold, said controller deactivates said switching circuit to stop the application of the selected voltage and current to the memory circuit.

2. The memory purge system according to claim 1, wherein the voltage and current are applied to the memory circuit for a predetermined period of time.

3. The memory purge system according to claim 2, wherein, if the detected current does not drop below the threshold within the predetermined period of time, said controller selects a second voltage, higher than the first voltage, to be supplied by said power supply and reactivates said switching circuit to apply the selected second voltage and current to the memory circuit for the predetermined period of time.

4. The memory purge system according to claim 1, wherein said switching circuit comprises a transistor.

5. The memory purge system according to claim 4, wherein said switching circuit further comprises a diode for blocking current flowing from the memory circuit.

6. The memory purge system according to claim 1, wherein said power supply comprises a converter for converting input power into the selected voltage and current.

7. The memory purge system according to claim 6, wherein the input power is supplied by the power source external to the memory device.

8. The memory purge system according to claim 1, wherein the memory device includes a plurality of memory circuits, and the memory purge system further comprises a respective plurality of switching circuits.

9. The memory purge system according to claim 8, wherein said controller applies the selected voltage and current to each of the plurality of memory circuits by activating each respective switching circuit independently in series.

10. A method for destructively purging a memory device, the method comprising the steps of:
   selecting a voltage and current supplied by a power supply;
   activating a switching circuit connecting the power supply to a memory circuit of the memory device to apply the selected voltage and current to the memory circuit;
   detecting current between the power supply and the memory circuit; and
   deactivating the switching circuit if the detected current drops below a threshold,
   wherein the switching circuit is activated in response to a purge command.

11. The method according to claim 10, wherein the voltage and current are applied to the memory circuit of the memory device for a predetermined period of time.

12. The method according to claim 11, further comprising the steps of:
   increasing the supplied voltage by a predetermined period of time; and
   reactivating the switching circuit for the predetermined period of time to apply the increased voltage and current to the memory circuit.

13. The method according to claim 12, further comprising the step of repeating said increasing step and said reactivating step until the current detected in said detecting step drops below the threshold.

14. A method for destructively purging a memory device including a plurality of memory circuits, each memory circuit having a respective switching circuit, the method comprising the step of repeating the steps of the method according to any one of claims 10 and 11–13 for each memory circuit.

* * * * *